United States Patent
Sera et al.

(10) Patent No.: US 9,786,501 B2
(45) Date of Patent: Oct. 10, 2017

(54) PHOTORESIST FILM PLACING METHOD, SEMICONDUCTOR DEVICE MANUFACTURING METHOD, ELECTRO-OPTICAL DEVICE, AND ELECTRONIC DEVICE

(71) Applicant: SEIKO EPSON CORPORATION, Tokyo (JP)

(72) Inventors: Hiroshi Sera, Nagano (JP); Yoshiki Nakashima, Nagano (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 14/681,344

(22) Filed: Apr. 8, 2015

(65) Prior Publication Data

US 2015/0294859 A1 Oct. 15, 2015

(30) Foreign Application Priority Data

Apr. 14, 2014 (JP) ................. 2014-082547

(51) Int. Cl.
*G03F 7/38* (2006.01)
*H01L 21/027* (2006.01)
*G03F 7/40* (2006.01)
*G03F 7/00* (2006.01)

(52) U.S. Cl.
CPC ........ *H01L 21/0274* (2013.01); *G03F 7/0035* (2013.01); *G03F 7/40* (2013.01)

(58) Field of Classification Search
USPC ........................................ 430/325
See application file for complete search history.

(56) References Cited

U.S. PATENT DOCUMENTS

| 7,344,931 | B2 | 3/2008 | Sera et al. |
| 2006/0008955 | A1* | 1/2006 | Sera ................. H01L 27/1214 438/163 |
| 2006/0121680 | A1 | 6/2006 | Tanaka |
| 2007/0267704 | A1 | 11/2007 | Yang et al. |
| 2008/0090186 | A1 | 4/2008 | Harumoto et al. |

FOREIGN PATENT DOCUMENTS

| JP | 2003-248293 A | 9/2003 |
| JP | 2006-054424 A | 2/2006 |
| JP | 2006-186349 A | 7/2006 |
| JP | 2007-013055 A | 1/2007 |
| JP | 2007-311767 A | 11/2007 |
| JP | 2008-091752 A | 4/2008 |

* cited by examiner

*Primary Examiner* — Daborah Chacko Davis
(74) *Attorney, Agent, or Firm* — Global IP Counselors, LLP

(57) ABSTRACT

A method for placing a resist film of a region having a small film thickness with good shape accuracy is provided. The method has processes of placing a photoresist film 15 on a substrate body 10, exposing the photoresist film 15 using a halftone mask 30 having light transmittances of three or more tones, and developing the photoresist film 15. The photoresist film 15 after the development has a first photoresist film 16 and a second photoresist film 17 that is thicker than the first photoresist film 16. On the substrate body 10 after the development, the second photoresist film 17 is placed at a location where the second photoresist film 17 can be placed without removing the photoresist film 15.

5 Claims, 8 Drawing Sheets

PHOTORESIST FILM PLACING METHOD, SEMICONDUCTOR DEVICE MANUFACTURING METHOD, ELECTRO-OPTICAL DEVICE, AND ELECTRONIC DEVICE

This application claims a priority to Japanese Patent Application No. 2014-082547 filed on Apr. 14, 2014 which is hereby expressly incorporated by reference in its entirety.

BACKGROUND

1. Technical Field

Several aspects of the present invention relate to a photoresist film placing method, a semiconductor device manufacturing method, an electro-optical device, and an electronic device.

2. Related Art

The photosensitive material used to form a photoresist film in a photolithography process or the like in manufacturing of a semiconductor device is widely used not only in the manufacturing of a semiconductor device but also in the field of MEMSs (microelectromechanical systems) and the like.

For example, it is used as an etching mask for three-dimensionally forming a movable portion of a MEMS. In the case of forming a step with respect to a depth direction, use of a photoresist film facilitates processing with favorable accuracy maintained.

In the field of TFTs (Thin Film Transistors), which are thin-film semiconductor devices, a photoresist film is used to control the amount of impurity to be injected that is necessary for a silicon layer or to designate a region into which the impurity is injected in order to form a channel doping structure for shifting operation characteristics in advance in a channel portion of a TFT, or in order to form a GOLD (Gate-drain Overlapped LDD) structure. JP-A-2006-54424 discloses a method in which a TFT having an LDD structure is formed using a mask having a diffraction grating pattern or a mask having a halftone portion. According to this, a resist pattern having a region with a small film thickness is formed at an end portion with respect to a center portion. Then, a conductive film formed on a semiconductor layer is etched to form a gate electrode having a region with a small film thickness at an end portion with respect to a center portion. An impurity is injected into the semiconductor layer, with this gate electrode as a mask.

In the aforementioned MEMS and TFT forming methods, a thin resist portion and a thick resist portion are temporarily placed, and thereafter a process of removing the thin resist portion is performed. After this process, the thick resist portion that has been partially removed in the process will be used as a mask in a subsequent process. Accordingly, in order for the subsequent process to be correctly performed, for example, the thick resist portion that has been partially removed needs to have a predetermined film thickness. However, the amount of the resist to be removed and a developing capability of a developer are difficult to manage with the previous methods, and there is a problem in that the film thickness and the plane shape of the thick resist portion that has been partially removed after the removal of the thin resist portion significantly vary, which may possibly affects the quality.

SUMMARY

The invention has been made in order to solve at least a part of the above-described object or problem, and can be achieved as the following modes or application examples.

APPLICATION EXAMPLE 1

In a photoresist film placing method according to an aspect of the invention, a first photoresist film formed on a substrate using a photomask having regions with different light transmittances of three or more tones is exposed to form a second photoresist film, and a part of a third photoresist film formed by developing the second photoresist film using a predetermined developer covers a region into which a predetermined impurity to be thereafter injected into the substrate is not injected and a region into which the predetermined impurity may or may not be injected.

With this method, the region in which the third photoresist film is placed can be widened. For this reason, control can be performed for further reducing the volume of the photoresist film to be dissolved by a developer when removing the second photoresist film, the dissolution capability of the developer can be preferably maintained, and the film thickness and the shape of the photoresist film to be left can be easily managed.

APPLICATION EXAMPLE 2

A semiconductor device manufacturing method according to an aspect of the invention is a semiconductor device manufacturing method including: forming a photoresist film on a substrate; exposing the photoresist film using a photomask having regions with different light transmittances of three or more tones; developing the exposed photoresist film, using a developer; and injecting a first predetermined impurity into the substrate, with the developed photoresist film as a mask. The three or more tones are a first tone that blocks exposure light used in the exposing, a second tone that mostly transmits the exposure light, and one or more third tones that transmit the exposure light at a predetermined ratio. A region of the photomask with the first tone is a region corresponding to a first region of the substrate into which the first predetermined impurity is not injected, and a second region of the substrate into which the first predetermined impurity may or may not be injected. After the developing, a thickness of the photoresist film in the first region and the second region is larger than a thickness of the photoresist film in a third region exposed with the third tones. The thickness of the photoresist film in the third region is a thickness that is able to block the first predetermined impurity at a ratio corresponding to the predetermined ratio.

With this method, exposure is performed using the photomask having regions with different light transmittances of three or more tones in the exposing, and thereafter the development is performed. Control can thereby be performed for further reducing the volume of the photoresist film to be removed in the developing. For this reason, characteristics of the developer in the developing less change, and the thickness and the shape of the photoresist film to be left in the development can be easily controlled. By handling the second region that does not relate to impurity injection equally to the first region into which the impurity is not injected, the volume of the photoresist film to be dissolved in the developing becomes small. As a result, the thickness and the shape of the photoresist film to be left in the third region can be made preferable.

Furthermore, the photoresist film having a largest film thickness is left in the first region and the second region on the substrate, and the photoresist film having a thickness smaller than the thickness of the photoresist film left is the first region and the second region is left in the third region. If the photoresist film left in the third region can block injection of the first predetermined impurity, the photoresist film left in the first region and the second region can also block injection of the first predetermined impurity. Both photoresist films can be used as masks when injecting the first predetermined impurity, and the first predetermined impurity can be injected into a region on the substrate corresponding to a region with the second tone of the photomask.

APPLICATION EXAMPLE 3

In the above-described semiconductor device manufacturing method, it is preferable that a developer used in the developing is a new liquid.

Here, the "new liquid" refers to a liquid in which components of the developer are mixed, and that has not been used in development. The new liquid does not contain components of the photoresist film, and it is considered that the capability of the new liquid to develop the photoresist film maintains a known predetermined capability. Accordingly, with this method, use of the new liquid allows the film thickness and the shape of the photoresist film that is to be removed in the development to be accurately managed by managing developing time, temperature, and the like.

APPLICATION EXAMPLE 4

In the above-described semiconductor device manufacturing method, it is preferable that a developer used in the developing is applied onto the substrate using a slit nozzle.

The slit nozzle refers to linearly arranged round-hole nozzles for supplying the developer. With this method, the amount of the developer supplied onto the substrate can be easily made uniform regardless of the location, by supplying the developer onto the substrate while moving the slit nozzle along the substrate. As a result, the photoresist film can be developed with accurate film thickness and shape.

APPLICATION EXAMPLE 5

In the above-described semiconductor device manufacturing method, it is preferable that the developer is applied onto the substrate using puddle development or spin development.

With this method, the amount of the developer supplied onto the substrate can be made uniform regardless of the location, using the puddle development or the spin development. As a result, the photoresist film can be developed with an accurate film thickness. As a result, the photoresist film can be placed without reducing development accuracy regarding variation, irregularity, or the like.

APPLICATION EXAMPLE 6

In the above-described semiconductor device manufacturing method, it is preferable that removing the photoresist film in the third region and injecting a second predetermined impurity into the substrate are further included, and a thickness of the photoresist film in the first region and the second region after the removing is a thickness that is able to block the injection of the second predetermined impurity.

With this method, only the photoresist film of the first region and the second region is left after the removing. The left photoresist film blocking injection of the second predetermined impurity allows various manners of injecting the impurity in the region in which the photoresist film is not left, depending on a setting of the third tones of the photomask.

APPLICATION EXAMPLE 7

An electro-optical device according to an aspect of the invention preferably uses the semiconductor device manufactured by any of the above-described semiconductor device manufacturing methods.

With this configuration, an electro-optical device with small variation in performance can be provided.

APPLICATION EXAMPLE 8

An electronic device according to an aspect of the invention preferably includes the above-described electro-optical device.

With this configuration, an electronic device can be provided with small variation in performance in the part of the electro-optical device included in the electronic device.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
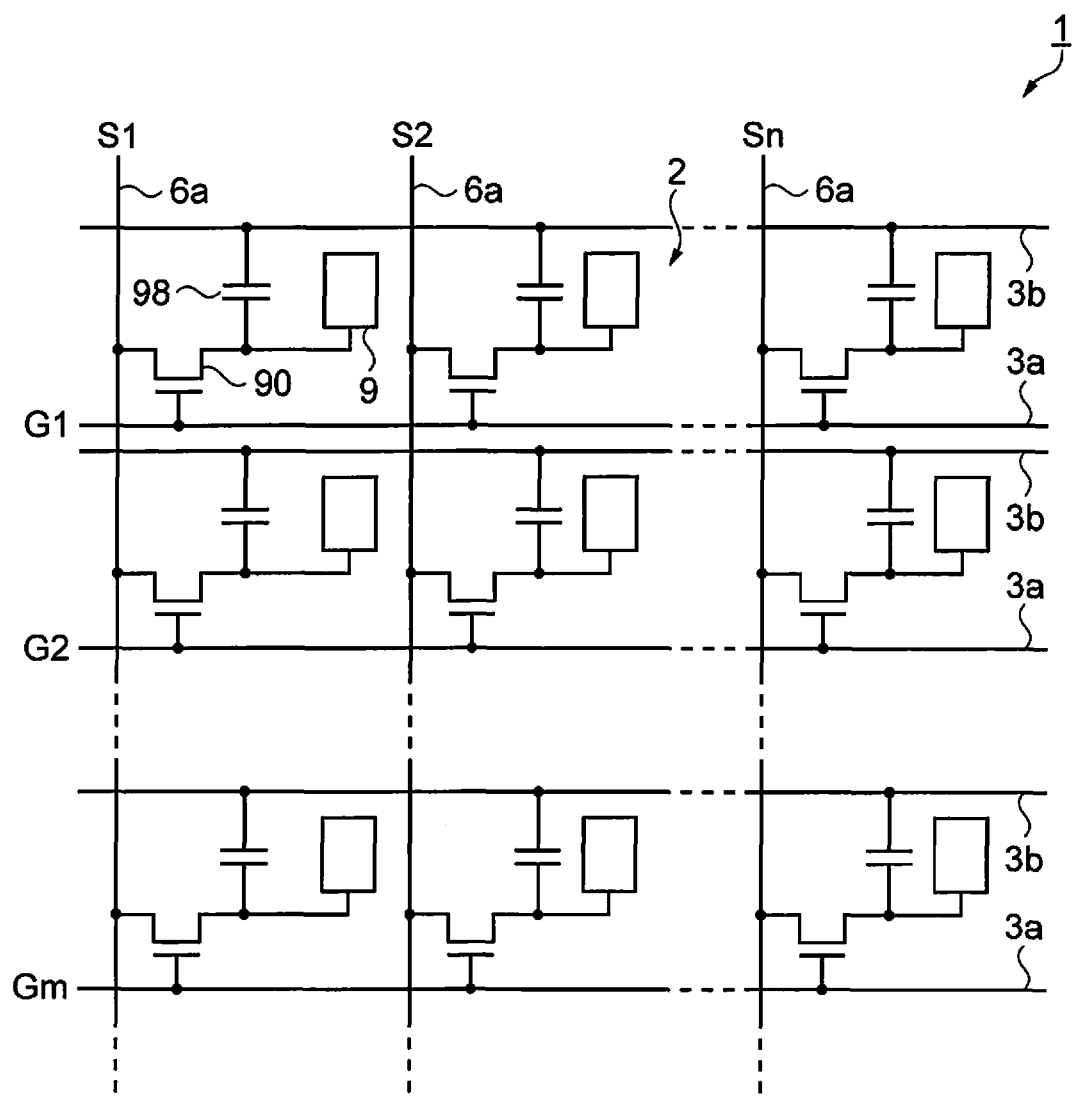
FIG. 1 is an equivalent circuit diagram of switching elements, signal lines, and the like in a plurality of dots that constitute an image display region of a liquid crystal device according to a first embodiment and are arranged in a matrix.

The present embodiment will described a characteristic example of a liquid crystal device and a liquid crystal device manufacturing method in accordance with the drawings. Note that members in the drawings are shown with different contraction scales so as to have a size that allows the members to be recognized in the drawings.

First Embodiment

Structure of Electro-Optical Device

Figure 2:
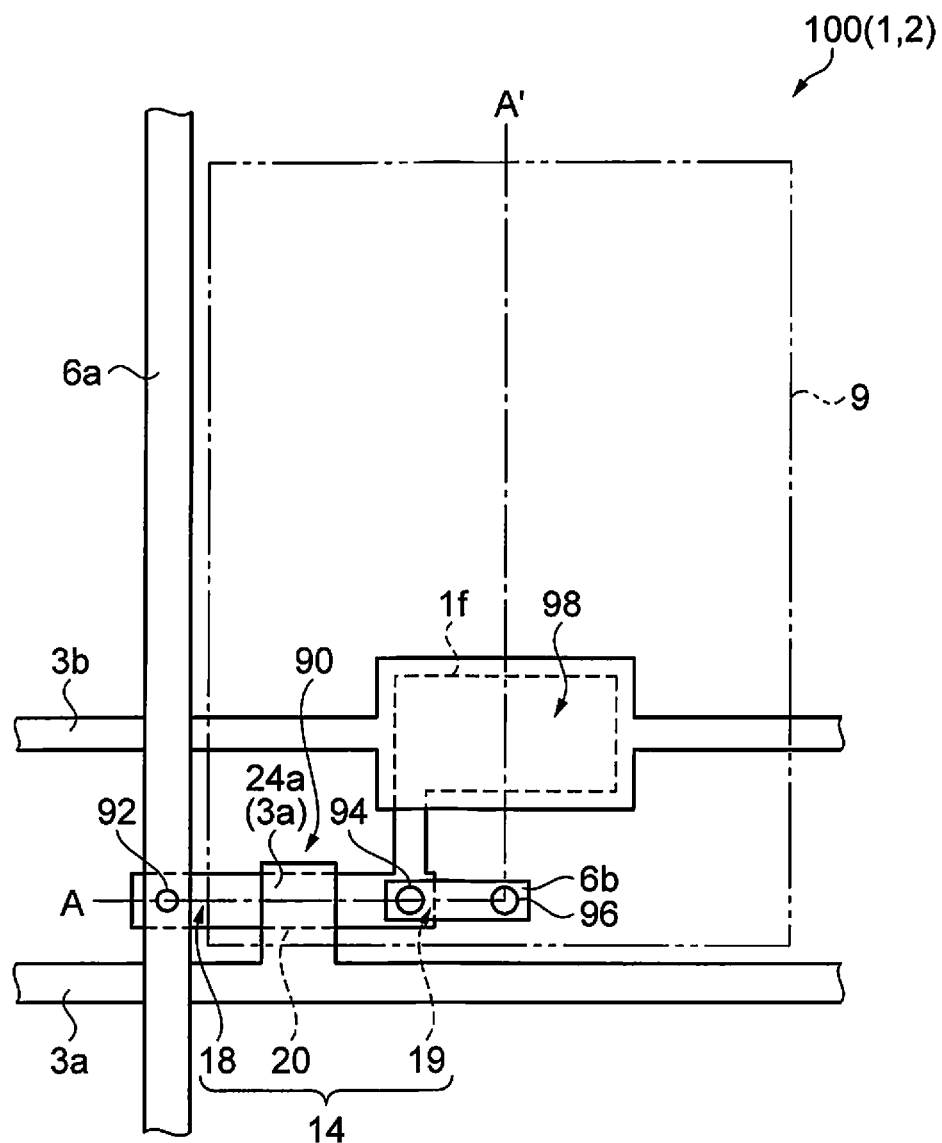
FIG. 2 is a schematic plan view enlarging a dot of a TFT array substrate in which a data line, a scan line, a pixel electrode, and the like are formed.
Figure 3:
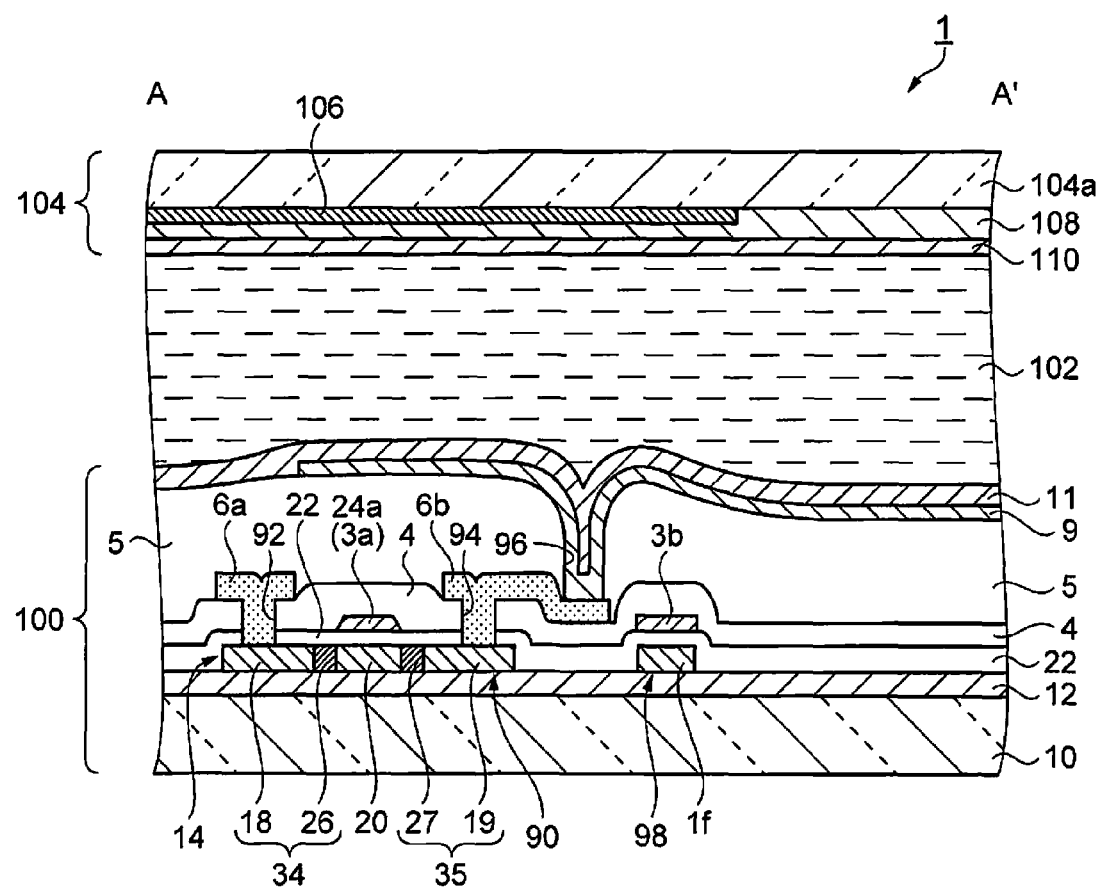
FIG. 3 is a schematic side cross-sectional view showing a structure of the liquid crystal device.

A structure of an electro-optical device in the present embodiment will be described based on FIGS. 1 to 3. The present embodiment will describe an example of a transmission liquid crystal device of an active matrix type using a TFT (thin film semiconductor device) as a switching element. FIG. 1 is an equivalent circuit diagram of switching elements, signal lines, and the like in a plurality of dots that constitute an image display region of a liquid crystal device in the present embodiment and are arranged in a matrix. FIG. 2 is a schematic plan view enlarging a dot of a TFT array substrate in which a data line, a scan line, a pixel electrode, and the like are formed. FIG. 3 is a schematic side cross-sectional view showing a structure of the liquid crystal device in the present embodiment, and is a cross-sectional view taken along line A-A' in FIG. 2. Note that FIG. 3 shows the case where the upper side is a light incident side, and the lower side is a visually recognized side (i.e., side of an observer).

As shown in FIG. 1, in a liquid crystal device 1, which serves as an electro-optical device, a plurality of dots 2 are installed that constitute an image display region and are arranged in a matrix. In each dot 2, a pixel electrode 9 and a TFT 90 (thin film semiconductor device), which is a switching element for controlling the pixel electrode 9 and serves as a semiconductor device, are formed. A data line 6a to which an image signal is supplied is electrically connected to a source of the TFT 90. Image signals S1, S2, ..., Sn to be written to data lines 6a are successively supplied in this order to the data lines, or are supplied to each group constituted by a plurality of adjoining data lines 6.

A scan line 3a is electrically connected to a gate of the TFT 90, and scan signals G1, G2, ..., Gm are applied sequentially to scan lines 3a in the form of pulses at predetermined timings. The pixel electrode 9 is electrically connected to a drain of the TFT 90, and the image signals S1, S2, ... Sn supplied from data lines 6a are written to corresponding pixel electrodes 9 at predetermined timings by turning on the TFTs 90 serving as switching elements, during a fixed time period.

The image signals S1, S2, ... Sn each at a predetermined level written to liquid crystals via the pixel electrodes 9 are held between the pixel electrodes and a later-described common electrode for a fixed time period. The liquid crystals modulate light and enable gradation display as a result of the orientation and order of a molecular assembly changing in accordance with an applied voltage level. Here, in order to prevent the held image signals from leaking, a storage capacitor 98 is added in parallel with a liquid crystal capacitor that is formed between each pixel electrode 9 and the common electrode.

As shown in FIG. 3, the liquid crystal device 1 in the present embodiment is schematically configured to include a TFT array substrate 100 in which the TFTs 90 and the pixel electrodes 9 are formed, and a facing substrate 104 in which a common electrode 108 is formed, the TFT array substrate 100 and the common electrode 108 being arranged in a facing manner so as to sandwich a liquid crystal layer 102.

A planer structure of the TFT array substrate 100 will be described below based on FIG. 2. The TFT array substrate 100 is provided with a plurality of rectangular pixel electrodes 9 in a matrix. The data line 6a, the scan line 3a, and a capacitor line 3b are provided along vertical and horizontal boundaries of each pixel electrode 9. In the present embodiment, a region in which each pixel electrode 9, as well as the data line 6a, the scan line 3a, and the like arranged so as to surround the pixel electrode 9 are formed is one dot 2.

The data line 6a is electrically connected, via a contact hole 92, to a source-side high concentration region 18 of a polycrystal semiconductor film 14 constituting the TFT 90. The pixel electrode 9 is electrically connected to a drain-side high concentration region 19 of the polycrystal semiconductor film 14, via a contact hole 96, a source line 6b, and a contact hole 94. A part of the scan line 3a is expanded so as to face a channel region 20, which serves as a third region of the polycrystal semiconductor film 14, and the expanded portion of the scan line 3a functions as a gate electrode 24a. The portion of the scan line 3a functioning as the gate electrode 24a will be hereinafter referred to simply as a "gate electrode". The polycrystal semiconductor film 14 constituting the TFT 90 is extended to a portion facing the capacitor line 3b, and the storage capacitor 98 (storage capacitor element) is formed with this extended portion if as a lower electrode and the capacitor line 3b as an upper electrode.

Next, a cross-sectional structure of the liquid crystal device in the present embodiment will be described based on FIG. 3. The TFT array substrate 100 is constituted mainly by a substrate body 10 (translucent substrate) serving as a substrate made of a translucent material such as glass, the pixel electrode 9 formed on a surface of the TFT array substrate 100 on the side of the liquid crystal layer 102, the TFT 90, and an alignment film 11. The facing substrate 104 is constituted mainly by a substrate body 104a made of a translucent material such as glass, a common electrode 108 formed on a surface of the substrate body 104a on the side of the liquid crystal layer 102, and an alignment film 110.

Specifically, in the TFT array substrate 100, a base protection film 12 (buffer film) made of a silicon oxide film or the like is formed immediately above the substrate body 10. The pixel electrode 9 made of a transparent conductive material such as indium tin oxide (ITO) is provided on the surface of the TFT array substrate 100 on the side of the liquid crystal layer 102, and the TFT 90 for pixel switching that controls switching of the corresponding pixel electrode 9 is provided at a position adjacent to the pixel electrode 9.

The polycrystal semiconductor film 14 made of polycrystal silicon is formed in a predetermined pattern on the base protection film 12. A gate insulating film 22 made of a silicon oxide film or the like is formed on this polycrystal semiconductor film 14. The gate electrode 24a (scan line 3a) is formed on this gate insulating film 22. In the present embodiment, a side face of the gate electrode 24a is tapered with respect to a surface of the gate insulating film 22. A region of the polycrystal semiconductor film 14 facing the gate electrode 24a via the gate insulating film 22 is a channel region 20 in which a channel is formed by an electric field from the gate electrode 24a. In the polycrystal semiconductor film 14, a source region 34 is formed on one side (left side in FIG. 3) of the channel region 20, and a drain region 35 is formed on the other side (right side in FIG. 3). The pixel switching TFT 90 is constituted by the gate electrode 24a, the gate insulating film 22, the data line 6a, the source line 6b, as well as the source region 34, the channel region 20, and the drain region 35 of the polycrystal semiconductor film 14, and the like.

In the present embodiment, the pixel switching TFT 90 has an LDD structure. In the source region 34 and the drain region 35, high concentration regions (source-side high concentration region 18, drain-side high concentration region 19) each having a relatively high impurity concentration, and low concentration regions (LDD regions (source-side low concentration region 26, drain-side low concentration region 27)) each having a relatively low impurity concentration are formed. Note that the operation characteristics of the TFT 90 may be adjusted by causing the channel region 20 to contain impurity. The operation characteristics indicating a relationship between voltage and current with which the TFT 90 operates can thereby be changed. Adjusting the operation characteristics of the TFT 90 will be referred to as "shifting the operation characteristics".

In the TFT array substrate 100, a first interlayer insulating film 4 made of a silicon oxide film or the like is formed on the scan line 3a (gate electrode 24a). The data line 6a and the source line 6b are formed on this first interlayer insulating film 4. The data line 6a is electrically connected to the source-side high concentration region 18 of the polycrystal semiconductor film 14 via the contact hole 92 formed in the first interlayer insulating film 4, and the source line 6b is electrically connected to the drain-side high concentration region 19 of the polycrystal semiconductor film 14 via the contact hole 94 formed in the first interlayer insulating film 4.

A second interlayer insulating film 5 made of a silicon nitride film or the like is formed on the first interlayer insulating film 4 on which the data line 6a and the source line 6b are formed. The pixel electrode 9 is formed on the second interlayer insulating film 5. The pixel electrode 9 is electrically connected to the source line 6b via the contact hole 96 formed in the second interlayer insulating film 5. The capacitor line 3b, which is formed on the same layer as the scan line 3a and serves as an upper electrode, is arranged so as to face the extended portion 1f (lower electrode) of the drain-side high concentration region 19 of the polycrystal semiconductor film 14, via an insulating film (dielectric film) that is integrally formed with the gate insulating film 22, and the storage capacitor 98 is formed by the extended portion 1f and the capacitor line 3b. The alignment film 11 for controlling the arrangement of liquid crystal molecules within the liquid crystal layer 102 is formed on the outermost surface of the TFT array substrate 100 on the side of the liquid crystal layer 102.

Meanwhile, in the facing substrate 104, a light shielding film 106 is formed on a surface of the substrate body 104a on the side of the liquid crystal layer 102. The light shielding film 106 prevents the light entering the liquid crystal device at least from entering the channel region 20, the source-side low concentration region 26, and the drain-side low concentration region 27 of the polycrystal semiconductor film 14. The common electrode 108 made of ITO or the like is formed over the almost entire surface of the substrate body 104a on which the light shielding film 106 is formed. The alignment film 110 for controlling the arrangement of liquid crystal molecules within the liquid crystal layer 102 is formed on the common electrode 108 on the side of the liquid crystal layer 102.

Thin film semiconductor device manufacturing method

FIGS. 4 to 7 are schematic diagrams for illustrating a semiconductor device manufacturing method. FIGS. 4 to 7 show a method for manufacturing a semiconductor device of an n-channel TFT having an LDD structure according to the present embodiment, in the order of the processes.

Figure 4A:
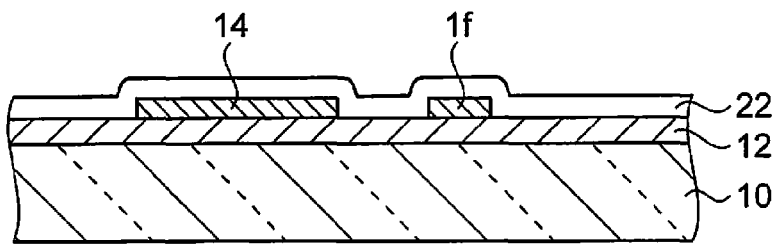
FIGS. 4A to 4D are schematic views for illustrating a semiconductor device manufacturing method.

Initially, as shown in FIG. 4A, a translucent substrate such as a glass substrate that has been cleaned by ultrasonic cleaning or the like is prepared as the substrate body 10. Thereafter, under a condition in which the substrate surface temperature is 150 to 450° C., the base protection film 12 (buffer film) made of a silicon oxide film or the like is deposited so as to have a thickness of 100 nm to 500 nm over the entire surface of the substrate body 10, using a plasma CVD method or the like. As a source gas to be used in this process, a mixed gas of monosilane and dinitrogen oxide, TEOS (tetraethoxysilane, $Si(OC_2H_5)_4$) and oxygen, disilane and ammonia, or the like are preferable.

Next, an amorphous semiconductor film made of amorphous silicon is deposited so as to have a thickness of 30 nm to 100 nm over the entire surface of the base protection film 12, using a plasma CVD method or the like. Disilane or monosilane is preferable as a source gas to be used in this process. Next, the polycrystal semiconductor film 14 and the extended portion 1f that are made of polycrystal silicon obtained by polycrystalizing the amorphous semiconductor film are formed by performing laser annealing on the amorphous semiconductor film, for example, and thereafter, a silicon oxide film, which is to serve as the gate insulating film 22, is deposited so as to have a thickness of 100 nm.

Figure 4B:
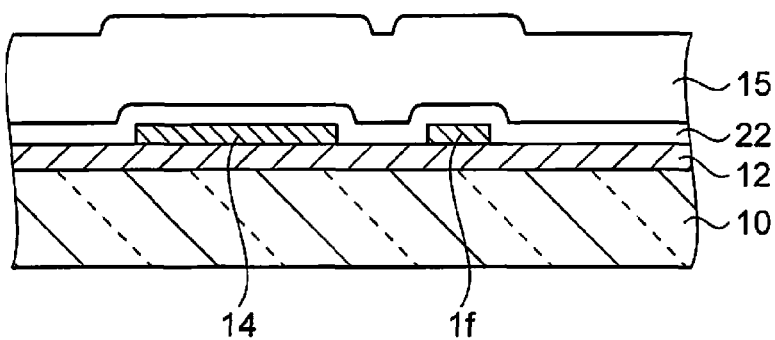

Next, as shown in FIG. 4B, in a resist application process, a photoresist material is applied and dried. A dipping method, a spin coating method, or the like may be used for the application. As a result, a photoresist film 15 is placed, which is a photoresist film having a film thickness of 2.5 μm and is to serve as a first photoresist film and a second photoresist film.

Figure 4C:
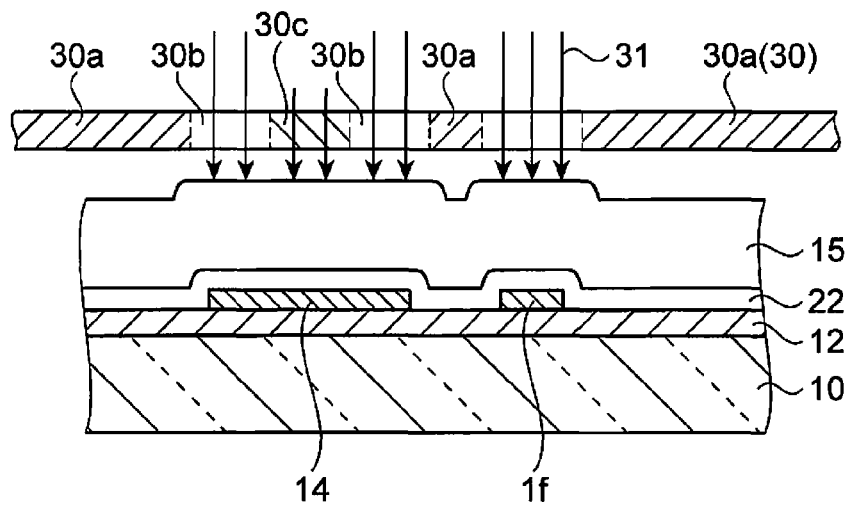

Next, as shown in FIG. 4C, an exposure process is performed. In the exposure process, a halftone mask 30 is used as a mask (reticle) having a predetermined pattern to be transferred onto the photoresist film 15 by the exposure. This halftone mask 30 has portions with three tones, namely a blocking portion 30a that blocks exposure light 31 radiated from an exposure apparatus and serves as a first tone, a transparent portion 30b that completely transmits the exposure light and serves as a second tone, and a semitransparent portion 30c that partially transmits the exposure light and serves as a third tone. The semitransparent portion 30c of the mask or the reticle is provided with a pattern formed by a semitransparent film, and the light intensity of the exposure light that is to be transmitted can be controlled.

Figure 4D:
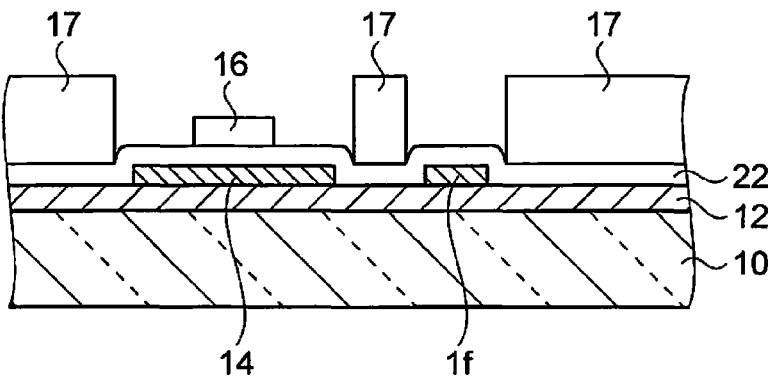

Next, a developing process is performed. In the developing process, a part of the photoresist film 15 is removed by a developer. A cross-section after performing the developing process is shown in FIG. 4D. In the present embodiment, for example, a positive resist material is used in the photoresist film 15. Upon the exposure being performed, the solubility to the developer increases, and the exposed portion is removed. The development is performed using an alkaline solution, and a chief material of the developer is TMAH (tetramethylammonium hydroxide), for example. Note that a negative photoresist material may be used in the photoresist film 15.

For the purpose of improving the resolution or the like, it is desirable to use a new liquid as the developer. Here, the "new liquid" refers to a liquid in which components of the developer are mixed, and that has not been used in development. Accordingly, the new liquid does not contain components of the photoresist film 15, has a high capability to develop the photoresist film 15, and has a known predetermined developing capability. Accordingly, it is possible to accurately manage the film thickness and the shape of the photoresist film 15 that is removed in the development, by managing developing time, temperature, and the like.

Furthermore, it is also desirable to use, as a development method, a method using a slit nozzle, with which the yield can be easily ensured. In the slit nozzle, round-hole nozzles for supplying the developer are linearly arranged. The slit nozzle has a shape in which the length of the nozzle arrangement is longer than the length of the substrate body 10. The developer is supplied from the slit nozzle onto the substrate body 10, while moving the slit nozzle along the substrate body 10. The amount of the developer supplied to the substrate body 10 can thereby be made uniform regardless of the location. As a result, a first photoresist film 16 serving as a first film can be developed so as to have accurate film thickness and shape.

Furthermore, the performance can also be improved by using puddle development or spin development as a developing method. With the puddle development, the amount of the developer supplied to the substrate body 10 can be made uniform regardless of the location. Also, when using the spin development, the amount of the developer supplied to the substrate body 10 can be made uniform regardless of the location. As a result, the first photoresist film 16 can be developed so as to have an accurate film thickness.

By thus performing the development, the first photoresist film 16 corresponding to the semitransparent portion 30c and a second photoresist film 17 corresponding to the blocking portion 30a and serving as a third photoresist film are formed from the photoresist film 15.

The first photoresist film 16 is more strongly irradiated with the exposure light 31 than the second photoresist film 17 is. Accordingly, in the development, the first photoresist film 16 is more removed than the second photoresist film 17 is, and becomes a thin film. The first photoresist film 16 is placed at a location facing the channel region 20, the source-side low concentration region 26, and the drain-side low concentration region 27 of the TFT 90.

The film thicknesses of the first photoresist film 16 and the second photoresist film 17 are formed so as to block injection of a predetermined impurity. In the present embodiment, for example, the film thickness of the first photoresist film 16 is 0.5 µm. The film thickness of the second photoresist film 17 in the present embodiment is 2.5 µm, for example.

Figure 5:
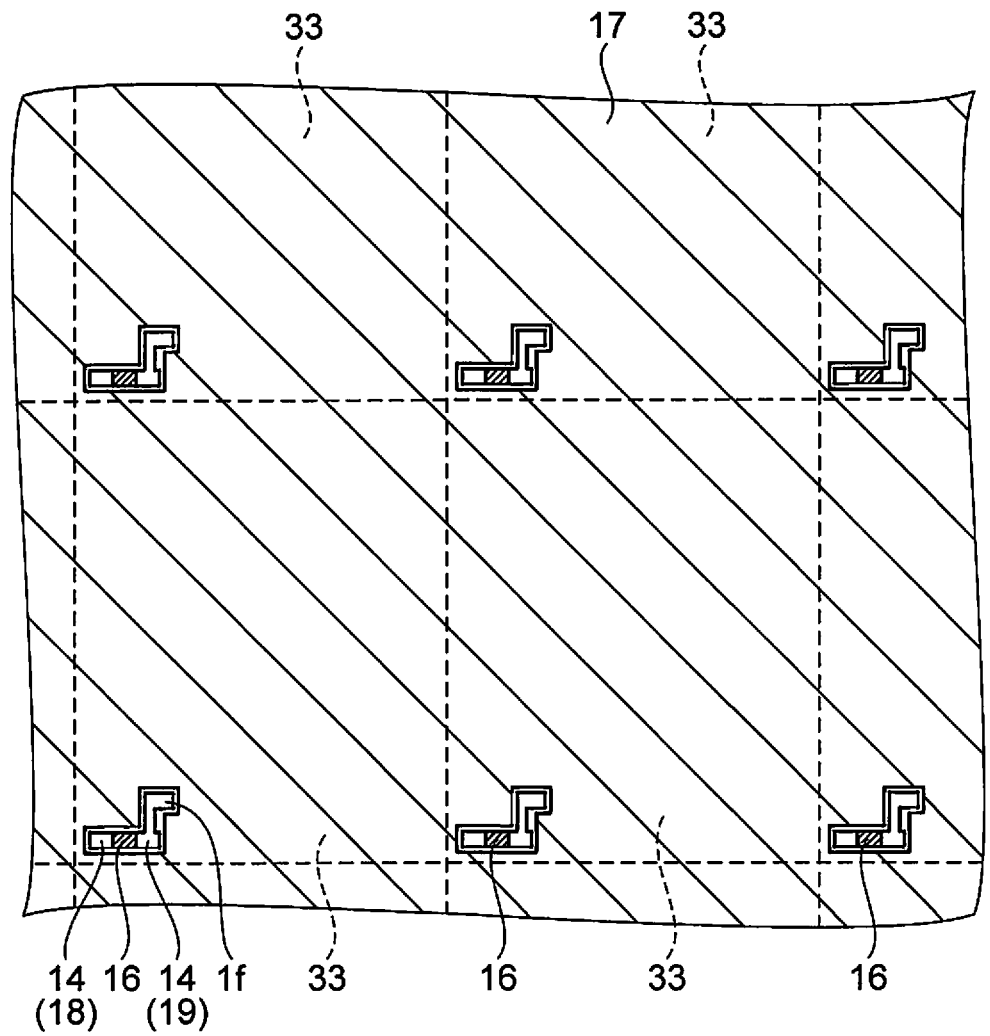
FIG. 5 is a schematic view for illustrating the semiconductor device manufacturing method.

FIG. 5 is a plan view when the substrate body 10 after the developing process is viewed from the direction of a processed surface. As shown in FIG. 5, the second photoresist film 17 is placed at a location excluding the polycrystal semiconductor film 14, the extended portion 1f, and a portion connecting the polycrystal semiconductor film 14 and the extended portion 1f.

The location where the second photoresist film 17 is placed includes both a region in which injection of the predetermined impurity needs to be blocked and a region in which the predetermined impurity does not need to be injected. Here, the region in which the predetermined impurity does not need to be injected is a region into which the predetermined impurity may or may not be injected. That is to say, this region is a region that is not affected even if the second photoresist film 17 is not placed, and may also be rephrased as a region that is not affected even if the first photoresist film 16 is not placed. Heretofore, a resist film in such a region has been removed.

In a plan view of the substrate body 10, a region of the liquid crystal layer 102 that is sandwiched by the common electrode 108 and the pixel electrode 9 and in which the light shielding film 106 is not placed is a display unit 33 that is to serve as a first region and a second region. The display unit 33 is a region to which voltage is applied and in which the light transmittance changes. The first region is a region into which the impurity is not injected, and the second region is a region into which the impurity may or may not be injected. In the present embodiment, the region in which the second photoresist film 17 is placed includes most of the region to serve as the display unit 33. On the other hand, leaving aside the amount of injection, the area of the region that needs injection of the predetermined impurity is small, and the ratio of this area to the whole is small.

Control can thereby be performed for reducing the volume of the photoresist film 15 to be developed, and the amount of the photoresist film 15 that has been dissolved and is contained in the developer can be reduced. The dissolution capability of the developer decreases as the photoresist film 15 is dissolved. When the amount of the photoresist film 15 in a portion to be dissolved by the developer is small, the film thickness to be dissolved per unit time can be more accurately managed than when this amount is large. In the present embodiment, the amount of the photoresist film 15 to be dissolved by the developer is reduced. Therefore, the film thickness and the shape of the first photoresist film 16 can be accurately managed. As a result, the first photoresist film 16 can be placed with an accurate shape, and variation in characteristics can thereby be reduced.

Figure 6A:
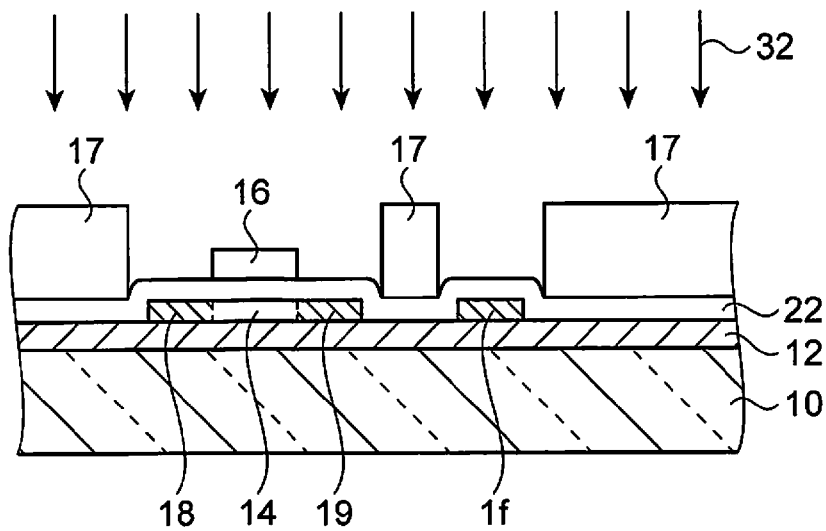
FIGS. 6A to 6C are schematic views for illustrating the semiconductor device manufacturing method.
Figure 6B:
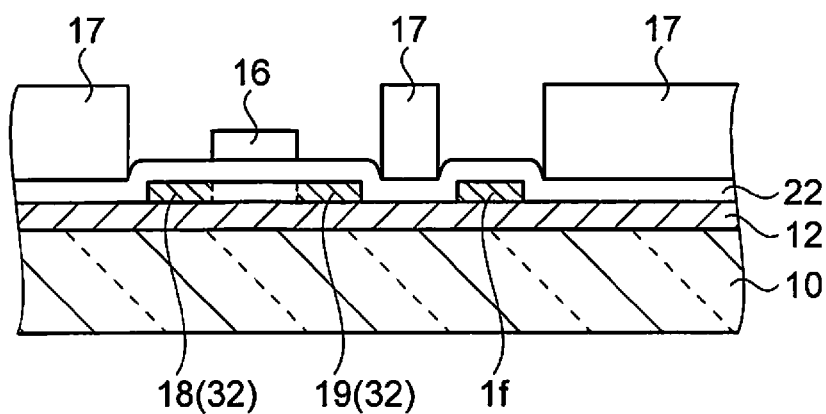

Next, as shown in FIG. 6A, a first impurity ion implantation process is performed. In this process, an impurity ion 32 serving as a high-concentration impurity is injected into the polycrystal semiconductor film 14, with the first photoresist film 16 and the second photoresist film 17 as masks. A phosphorus ion or an arsenic ion can be applied as the impurity ion 32. In the present embodiment, for example, a phosphorus ion is used as the impurity ion 32. The high-concentration impurity ion 32 is injected with a dose of $0.1 \times 10^{14}$ to approximately $10 \times 10^{15}$/cm2, for example. The injection of the impurity ion 32 is thereby blocked in the region of the first photoresist film 16 and the second photoresist film 17, and the impurity ion 32 is injected into the source-side high concentration region 18, the drain-side high concentration region 19, and the extended portion 1f. As a result, as shown in FIG. 6B, the source-side high concentration region 18, the drain-side high concentration region 19, the extended portion 1f, and a portion connecting the drain-side high concentration region 19 and the extended portion 1f have a composition containing the impurity ion 32.

Figure 6C:
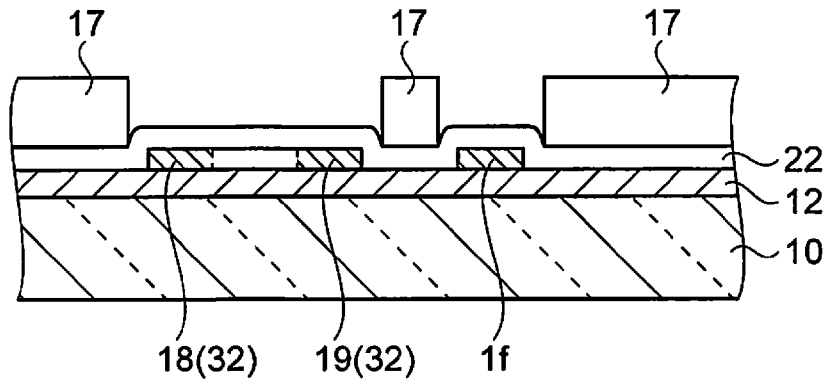

Subsequently, as shown in FIG. 6C, an ashing process is performed after the injection. The ashing process is performed using a dry etching method, and the first photoresist film 16 is removed. In the ashing process, both the first photoresist film 16 and the second photoresist film 17 are removed, and accordingly the film thickness of the second photoresist film 17 decreases. The film thickness of the second photoresist film 17 after the ashing process is a film thickness with which the impurity can be blocked at the time of injection for shifting the operation characteristics that is performed in a second impurity ion implantation process, which is a post-process. For example, the film thickness of the second photoresist film 17 is set to 0.3 µm or larger, which is a film thickness with which the injection of the impurity ion 32 is blocked in the second impurity ion implantation process.

In the developing process, a difference in the film thickness between the first photoresist film 16 and the second photoresist film 17 is controlled such that the impurity ion 32 does not pass through when injecting the impurity ion 32 in the second impurity ion implantation process. After the ashing process, the film thickness of the second photoresist film 17 decreases to a film thickness obtained by subtracting the film thickness of the first photoresist film 16 from the film thickness of the second photoresist film 17 before the ashing process. At this time as well, the impurity can be injected into a predetermined location with the second photoresist film 17 as a mask. Then, the second photoresist film 17 can block injection of the impurity ion 32.

Figure 7A:
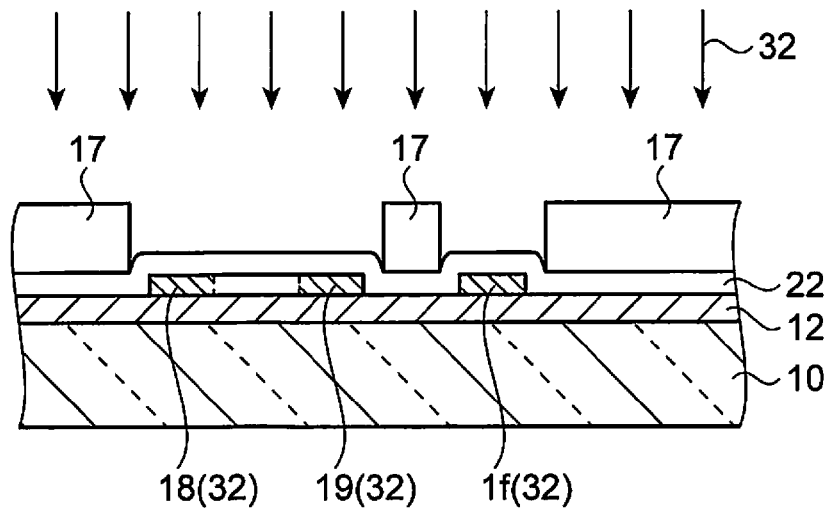
FIGS. 7A to 7C are schematic views for illustrating the semiconductor device manufacturing method.
Figure 7B:
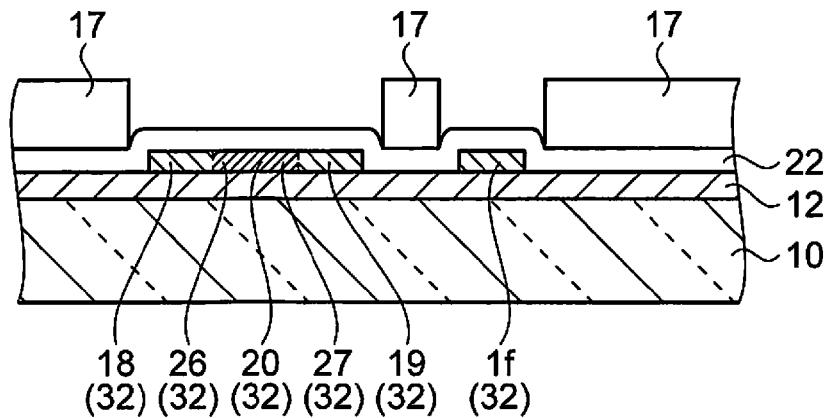

Next, as shown in FIG. 7A, a second impurity ion implantation process is performed. In this process, the impurity ion 32 is injected into the polycrystal semiconductor film 14 in a self-alignment manner. Then, an n-type semiconductor layer having operation characteristics that are shifted by a necessary amount is formed. At this time, the film thickness of the second photoresist film 17 is a film thickness with which injection of the impurity ion 32 is blocked. Accordingly, the impurity ion 32 is blocked by the second photoresist film 17, and accordingly the impurity ion 32 does not reach a location other than the polycrystal semiconductor film 14. As a result, as shown in FIG. 7B, the impurity ion 32 is injected at a low concentration into the channel region 20, the source-side low concentration region 26, and the drain-side low concentration region 27. The concentration of the impurity ion 32 is further increased in the source-side high concentration region 18, the drain-side high concentration region 19, the extended portion 1f, and a portion connecting the drain-side high concentration region 19 and the extended portion 1f.

Figure 7C:
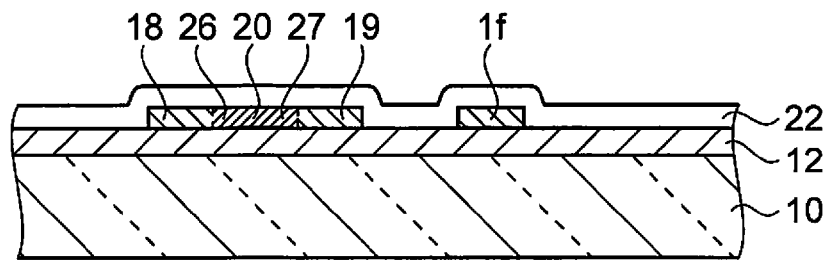

Next, as shown in FIG. 7C, the second photoresist film 17 is removed. Next, as shown in FIG. 3, the gate electrode 24a is formed. Next, a third impurity ion implantation process is performed. In this process, the impurity ion 32 is injected at a low concentration into the source-side high concentration region 18, the drain-side high concentration region 19, the source-side low concentration region 26, and the drain-side low concentration region 27, with the gate electrode 24a as a mask. Then, a semiconductor layer having an LDD structure can be formed by adjusting the concentration of the impurity ion 32 in the source-side high concentration region 18, the drain-side high concentration region 19, the source-side low concentration region 26, and the drain-side low concentration region 27.

In the present embodiment, in the first impurity ion implantation process, the impurity ion 32 is injected into the source-side high concentration region 18 and the drain-side high concentration region 19. The impurity ion 32 is not injected into the channel region 20. When the first photoresist film 16 is not placed at a location facing the channel region 20, the impurity ion 32 can be injected into the channel region 20. Accordingly, a TFT 90 whose operation characteristics are to be shifted in the second impurity ion implantation process and a TFT 90 whose operation characteristics are not to be shifted therein can be simultaneously formed on the same substrate. In this process, a device whose operation characteristics are stabilized can be formed without increasing the number of times of a photo-process, as compared with a general method of performing the photo-process in every step. As a result, elements having differently shifted operation characteristics can be manufactured with good productivity.

In the present embodiment, a difference in the film thickness between the first photoresist film 16 and the second photoresist film 17 is set such that the film thickness of the second photoresist film 17 after the ashing process does not allow the impurity ion 32 to pass through when injecting the impurity ion 32. Accordingly, in the second impurity ion implantation process after removing the first photoresist film 16, the impurity ion 32 can be injected into a predetermined location, with the second photoresist film 17 as a mask. As a result, the impurity ion 32 can be injected at a plurality of densities into the polycrystal semiconductor film 14.

In the present embodiment, the second photoresist film 17 is placed in a region that does not relate to injection of the predetermined impurity. The amount of the photoresist film 15 to be dissolved by the developer is thereby reduced, and accordingly the film thickness and the shape of the first photoresist film 16 can be accurately managed. As a result, the first photoresist film 16 can be placed with good shape accuracy.

In the present embodiment, in the first impurity ion implantation process, the impurity ion 32 is injected into the source-side high concentration region 18 and the drain-side high concentration region 19, with the first photoresist film 16 and the second photoresist film 17 as masks. In the second impurity ion implantation process, the impurity ion 32 is injected into the source-side high concentration region 18, the drain-side high concentration region 19, the source-side low concentration region 26, the drain-side low concentration region 27, and the channel region 20, with the second photoresist film 17 as a mask. In the third impurity ion implantation process, the impurity ion 32 is injected into the source-side high concentration region 18, the drain-side high concentration region 19, the source-side low concentration region 26, and the drain-side low concentration region 27, with the gate electrode 24a as a mask.

The impurity ion 32 can be injected a plurality of times with a small number of times of the photo-process, rather than performing the shifting of characteristics by injecting the impurity ion 32 and the patterning after performing the photo-process a plurality of number of times as before. Furthermore, since the first photoresist film 16 can be manufactured with accurate film thickness and plane shape, the area from the source-side low concentration region 26 to the drain-side low concentration region 27 can be accurately manufactured.

Second Embodiment

Electronic Device

Figure 8:
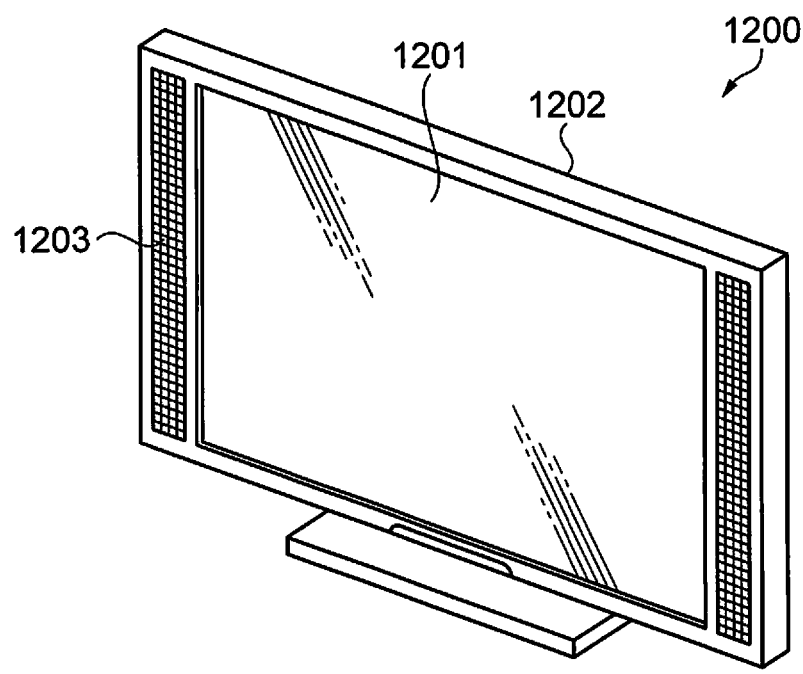
FIG. 8 is a schematic perspective view showing a configuration of a liquid crystal display television according to a second embodiment.

A specific example of a liquid crystal display television 1200 serving as an electronic device including the liquid crystal device 1 in the first embodiment will now be described using FIG. 8. FIG. 8 is a schematic perspective view showing a configuration of the liquid crystal display television. In FIG. 8, the liquid crystal display television 1200 has a television body 1202. A speaker 1203 and a liquid crystal device 1201 serving as an electro-optical device are installed in the television body 1202. The liquid crystal device 1 in the first embodiment is used as the liquid crystal device 1201.

In the process of manufacturing the liquid crystal device 1201, the first photoresist film 16 is placed with good shape accuracy. The liquid crystal device 1201 is a device including the TFT 90 in which an impurity has been injected into a polycrystal semiconductor film with good shape accuracy, with the first photoresist film 16 as a mask. Accordingly, it can be said that the liquid crystal device 1201 included in the liquid crystal display television 1200 is a device including the TFT 90 in which an impurity has been injected into a polycrystal semiconductor film with good shape accuracy, with the first photoresist film 16 as a mask.

Note that the above-described liquid crystal device 1 is also applicable to various electronic devices other than the liquid crystal display television 1200. For example, the liquid crystal device 1 can be applied to electronic devices such as a projector, a multimedia-enabled personal computer and engineering workstation (EWS), a pager, a word processor, a videotape recorder of a view finder type or a direct view monitor type, an electronic notebook, an electronic desk calculator, a car navigation device, a POS terminal, and a device having a touch panel.

Note that the technical scope of the invention is not limited to the above-described embodiments, and may be applied without departing from the gist of the invention. For example, the technical scope of the invention includes various modifications of the above-described embodiments. For example, although the halftone mask 30 in the first embodiment has three tones, it may have four or more tones. The halftone mask 30 may have tones of a mask suitable for a product to be manufactured. For example, although the first embodiment has described an example of forming an LDD structure in an n-type TFT, an LDD structure may also be formed in a p-type TFT. Furthermore, in the first embodiment, the impurity ion 32 is injected using the first photoresist film 16. The above process may also be used when performing etching using the first photoresist film 16.

What is claimed is:

1. An electro-optical device using a semiconductor device manufactured by a semiconductor device manufacturing method comprising:
    forming a photoresist film on a substrate;
    exposing the photoresist film using a photomask having regions with different light transmittances of three or more tones;
    developing the exposed photoresist film; and
    injecting a first predetermined impurity into the substrate, with the developed photoresist film as a mask,
    wherein the three or more tones are a first tone that blocks exposure light used in the exposing, a second tone that mostly transmits the exposure light, and one or more third tones that transmit the exposure light at a predetermined ratio,
    a region of the photomask with the first tone includes a region corresponding to a first region of the substrate which blocks the injection of the first predetermined impurity such that the first predetermined impurity is not injected into the first region of the substrate, and a region corresponding to a second region of the substrate which does not require the injection of the first predetermined impurity,
    after the developing, a thickness of the photoresist film in the first region and the second region is larger than a thickness of the photoresist film in a third region exposed with the third tones, and
    the thickness of the photoresist film in the third region is a thickness that blocks the first predetermined impurity at a ratio corresponding to the predetermined ratio, the semiconductor device manufacturing method further comprising
    completely removing the photoresist film in the third region, and decreasing a thickness of the photoresist film in the first region and the second region without completely removing the photoresist film in the first region and the second region, and
    injecting a second predetermined impurity into the substrate, with the photoresist film in the first region and the second region as a mask,
    wherein after the decreasing of the thickness of the photoresist film in the first region and the second region, the thickness of the photoresist film in the first region and the second region blocks the injection of the second predetermined impurity.

2. The electro-optical device according to claim 1, wherein a developer used in the developing is a new liquid in which components of the developer are mixed and which has not been used in development.

3. An electronic device comprising the electro-optical device according to claim 1.

4. An electro-optical device using a semiconductor device manufactured by a semiconductor device manufacturing method comprising:
    forming a photoresist film on a substrate;
    exposing the photoresist film using a photomask having regions with different light transmittances of three or more tones;
    developing the exposed photoresist film; and
    injecting a first predetermined impurity into the substrate, with the developed photoresist film as a mask,
    wherein the three or more tones are a first tone that blocks exposure light used in the exposing, a second tone that mostly transmits the exposure light, and one or more third tones that transmit the exposure light at a predetermined ratio,
    a region of the photomask with the first tone includes a region corresponding to a first region of the substrate which blocks the injection of the first predetermined impurity such that the first predetermined impurity is not injected into the first region of the substrate, and a region corresponding to a second region of the substrate which does not require the injection of the first predetermined impurity,
    after the developing, a thickness of the photoresist film in the first region and the second region is larger than a thickness of the photoresist film in a third region exposed with the third tones, and
    the thickness of the photoresist film in the third region is a thickness that blocks the first predetermined impurity at a ratio corresponding to the predetermined ratio, the semiconductor device manufacturing method further comprising
    completely removing the photoresist film in the third region, and decreasing a thickness of the photoresist film in the first region and the second region without completely removing the photoresist film in the first region and the second region, and
    injecting a second predetermined impurity into the substrate, with the photoresist film in the first region and the second region as a mask,
    wherein after the decreasing of the thickness of the photoresist film in the first region and the second region, the thickness of the photoresist film in the first region and the second region blocks the injection of the second predetermined impurity, and
    a developer used in the developing is applied onto the substrate using a slit nozzle.

5. An electro-optical device
    using a semiconductor device manufactured by a semiconductor device manufacturing method comprising:
    forming a photoresist film on a substrate;
    exposing the photoresist film using a photomask having regions with different light transmittances of three or more tones;
    developing the exposed photoresist film; and
    injecting a first predetermined impurity into the substrate, with the developed photoresist film as a mask,
    wherein the three or more tones are a first tone that blocks exposure light used in the exposing, a second tone that mostly transmits the exposure light, and one or more third tones that transmit the exposure light at a predetermined ratio, a region of the photomask with the first tone includes a region corresponding to a first region of the substrate which blocks the injection of the first predetermined impurity such that the first predetermined impurity is not injected into the first region of the substrate, and a region corresponding to a second region of the substrate which does not require the injection of the first predetermined impurity, after the developing, a thickness of the photoresist film in the first region and the second region is larger than a thickness of the photoresist film in a third region exposed with the third tones, and the thickness of the photoresist film in the third region is a thickness that blocks the first predetermined impurity at a ratio corresponding to the predetermined ratio, the semiconductor device manufacturing method further comprising completely removing the photoresist film in the third region, and decreasing a thickness of the photoresist film in the first region and the second region without completely removing the photoresist film in the first region and the second region, and injecting a second predetermined impurity into the substrate, with the photoresist film in the first region and the second region as a mask, wherein after the decreasing of the thickness of the photoresist film in the first region and the second region, the thickness of the photoresist film in the first region and the second region blocks the injection of the second predetermined impurity, and the developer is applied onto the substrate using puddle development or spin development.

* * * * *